United States Patent
Jang et al.

(10) Patent No.: US 10,444,881 B2
(45) Date of Patent: Oct. 15, 2019

(54) TOUCH POWER CIRCUIT HAVING OPERATIONAL AMPLIFIER AND TOUCH DISPLAY DEVICE USING THE SAME

(71) Applicant: LG Display Co., Ltd., Seoul (KR)

(72) Inventors: Hoon Jang, Goyang-si (KR); Soon-Dong Cho, Gumi-si (KR); Juno Hur, Daegu (KR); Dong-Ju Kim, Busan (KR); Won-Yong Jang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 50 days.

(21) Appl. No.: 15/812,702

(22) Filed: Nov. 14, 2017

(65) Prior Publication Data

US 2018/0188865 A1    Jul. 5, 2018

(30) Foreign Application Priority Data

Dec. 30, 2016    (KR) .................. 10-2016-0184209

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/0416* (2013.01);
(Continued)

(58) Field of Classification Search
CPC ...... G06F 3/0412; G06F 3/0418; G06F 3/044; G06F 3/0416; G06F 2203/04107;
(Continued)

(56) References Cited

U.S. PATENT DOCUMENTS 9,223,425 B1 *  12/2015  Kim ...................... G06F 3/0412
2012/0074961 A1    3/2012  Herrmann
(Continued)

FOREIGN PATENT DOCUMENTS

EP         3 040 823 A1     7/2016

OTHER PUBLICATIONS

Jun et al., "In-Cell Self-Capacitive-Type Mobile Touch System and Embedded Readout Circuit in Display Driver IC," *Journal of Display Technology* 12(12):1613-1622, 2016.

(Continued)

*Primary Examiner* — Brent D Castiaux
(74) *Attorney, Agent, or Firm* — Seed IP Law Group LLP (57) ABSTRACT

Disclosed are a touch power circuit and a touch display device in which an operational amplifier buffers an input pulse having a first voltage and a higher second voltage alternate, and uses the buffered input pulse to provide an output pulse. The operational amplifier includes a non-inverting input terminal to which the input pulse is supplied, an inverting input terminal connected to the output terminal, and an output unit driven according to a result of amplifying a difference between a voltage of the non-inverting input terminal and a voltage of the inverting input terminal and configured to charge and discharge the output terminal. The circuits and devices may further include an offset voltage applier configured to supply an offset voltage having a first polarity to the non-inverting input terminal and/or the inverting input terminal to level-shift the input pulse.

19 Claims, 9 Drawing Sheets

(51) Int. Cl.
*H03F 3/45* (2006.01)
*G09G 3/36* (2006.01)

(52) U.S. Cl.
CPC ....... *G06F 3/0418* (2013.01); *H03F 3/45179* (2013.01); *G06F 2203/04107* (2013.01); *G09G 3/3677* (2013.01); *G09G 3/3688* (2013.01); *G09G 2310/08* (2013.01); *G09G 2330/02* (2013.01); *H03F 2203/45116* (2013.01); *H03F 2203/45151* (2013.01)

(58) Field of Classification Search
CPC ....... H03F 3/45179; H03F 2203/45116; H03F 2203/45151; G09G 3/3677; G09G 3/3688; G09G 2310/08; G09G 2330/02
See application file for complete search history.

(56) References Cited

U.S. PATENT DOCUMENTS

| | | | |
|---|---|---|---|
| 2012/0081320 A1* | 4/2012 | Hwang | G06F 3/0418 345/173 |
| 2015/0035787 A1* | 2/2015 | Shahparnia | G06F 3/044 345/174 |
| 2015/0042599 A1 | 2/2015 | Lukanc et al. | |
| 2015/0091843 A1 | 4/2015 | Ludden | |
| 2016/0098114 A1 | 4/2016 | Pylvas | |

OTHER PUBLICATIONS

Mancini (ed.), "OP Amps for Everyone," Design Reference SLOD006B, Texas Instruments, Aug. 31, 2002, 464 pages.

\* cited by examiner

TOUCH POWER CIRCUIT HAVING OPERATIONAL AMPLIFIER AND TOUCH DISPLAY DEVICE USING THE SAME

CROSS-REFERENCE TO RELATED APPLICATIONS

This application claims the benefit of Republic of Korea Patent Application No. 10-2016-0184209, filed on Dec. 30, 2016, which is hereby incorporated by reference in its entirety.

BACKGROUND

Technical Field

The present disclosure relates to a touch power circuit capable of improving operation deviation of an amplifier and a touch display device using the same.

Description of the Related Art

A touch sensor which can input information through touch on a display screen has been extensively applied to various display devices such as notebook computers, monitors, and home appliances, as well as portable information devices such as smartphones.

Touch technology applied to a display device is classified into add-on technology and in-cell technology according to the location of the touch sensor. The add-on technology is an external attachment scheme of the touch sensor in which a touchscreen panel is attached to the top of a display panel and the in-cell technology is an internal installation scheme of the touch sensor in which the display panel and the touchscreen panel are integrated by embedding a touch electrode inside the display panel.

The in-cell technology has evolved for greater slimness of the display device and has developed into an advanced in-cell touch (hereinafter, AIT) display device using an electrode obtained by splitting a common electrode of a liquid crystal display as the touch electrode.

The AIT display device time-divides each frame period into a data write period during which image data is written into pixels and a touch driving period during which a touch driving signal is applied to touch electrodes and whether touch is performed is sensed, thereby driving a touch display panel.

Recently, the AIT display device has used a load free driving (LFD) scheme in which, when the touch driving signal is applied to the touch electrodes during the touch driving period, modulation signals having the same phase as the touch driving signal are applied to data lines and gate lines to reduce load of the touch electrodes and improve touch sensing sensitivity.

For example, during the touch driving duration, a data driver simultaneously supplies a touch driving signal of a pulse form received from a touch power circuit to the touch electrodes and the data lines and a gate driver simultaneously supplies a gate-off modulation signal of a pulse form received from the touch power circuit to the gate lines.

In this case, the phase of the pulse waveform of the touch driving signal output from the touch power circuit should be the same as the phase of the pulse waveform of the gate-off modulation signal. If the phases are not equal, deviation of signals which are read out from the touch electrodes when there is no touch occurs and base raw data which is a reference upon performing touch determination becomes different, thereby lowering productivity.

However, since a touch power circuit of the related art generates operation characteristic deviation occurring when propagation delay characteristics of pulse waveforms become different due to offset deviation between operational amplifiers which buffer and output a gate-off modulation signal, the phase of the pulse waveform of the gate-off modulation signal is different from the phase of the pulse waveform of the touch driving signal.

BRIEF SUMMARY

Accordingly, the present disclosure is directed to a touch power circuit having an operational amplifier and a touch display device using the same that substantially obviate one or more problems due to limitations and disadvantages of the related art.

An object of the present disclosure is to provide a touch power circuit capable of improving productivity by enhancing operation deviation of an amplifier and a touch display device using the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a touch power circuit includes an operational amplifier configured to buffer an input pulse in which a first voltage and a second voltage greater than the first voltage alternate and output the buffered input pulse to an output terminal as an output pulse. The operational amplifier may include a non-inverting input terminal to which the input pulse is supplied, an inverting input terminal connected to the output terminal, and an output unit driven according to a result of amplifying a difference between a voltage of the non-inverting input terminal and a voltage of the inverting input terminal and configured to charge and discharge the output terminal using a high-potential power voltage higher than the second voltage and a low-potential power voltage similar to the first voltage or charge and discharge the output terminal using a high-potential power voltage similar to the second voltage and a low-potential power voltage lower than the first voltage. In some implementations, the touch power circuit may include an offset voltage applier configured to additionally supply an offset voltage having a first polarity to any one of the non-inverting input terminal and the inverting input terminal. The output pulse may be level-shifted relative to the input pulse by the offset voltage.

The output pulse may be level-shifted to be higher than the input pulse upon charging and discharging the output terminal using the high-potential power voltage higher than the second voltage and the low-potential power voltage similar to the first voltage.

The output pulse may be level-shifted to be lower than the input pulse upon charging and discharging the output terminal using the high-potential power voltage similar to the second voltage and the low-potential power voltage lower than the first voltage.

When the first voltage is a gate-off low voltage, the second voltage is a gate-off high voltage, the input pulse is a first gate-off modulation signal, and the output pulse is a second gate-off modulation signal, the output unit of the operational amplifier may be configured to charge and discharge the output terminal using a high-potential power voltage higher than the gate-off high voltage and a low-potential power voltage similar to the gate-off low voltage, or to charge and discharge the output terminal using a high-potential power voltage similar to the gate-off high voltage and a low-potential power voltage lower than the gate-off low voltage, and the second gate-off modulation signal may be level-shifted relative to the first gate-off modulation signal by the offset voltage.

The second gate-off modulation signal may be level-shifted to be higher than the first gate-off modulation signal upon charging and discharging the output terminal using the high-potential power voltage higher than the gate-off high voltage and the low-potential power voltage similar to the gate-off low voltage.

The touch power circuit may further include a second operational amplifier configured to buffer a first touch driving signal in which a common high voltage and a common low voltage alternate, and to output the buffered first touch driving signal as a second touch driving signal, and the second touch driving signal and the second gate-off modulation signal may have a same phase and a same amplitude.

When the first voltage is a common low voltage, the second voltage is a common high voltage, the input pulse is a first touch driving signal, and the output pulse is a second touch driving signal, the output unit of the operational amplifier may be configured to charge and discharge the output terminal using the high-potential power voltage higher than the common high voltage and the low-potential power voltage similar to the common low voltage, or to charge and discharge the output terminal using the high-potential power voltage similar to the gate-off high voltage and the low-potential power voltage lower than the common low voltage, and the second touch driving signal may be level-shifted relative to the first touch driving signal by the offset voltage.

The touch power circuit may further include a second operational amplifier configured to buffer a first gate-off modulation signal in which a gate-off low voltage and a gate-off high voltage alternate, and to output the buffered first gate-off modulation signal as a second gate-off modulation signal, and the second gate-off modulation signal and the second touch driving signal may have a same phase and a same amplitude.

In another aspect of the present disclosure, a touch display device includes the above-described touch power circuit, a touch-compatible data driver configured to supply a first touch driving signal supplied from the touch power circuit to touch electrodes and data lines of a panel during a touch driving period, and a gate driver configured to supply a first gate-off modulation signal supplied from the touch power circuit to gate lines of the panel during the touch driving period.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts.

Figure 1:
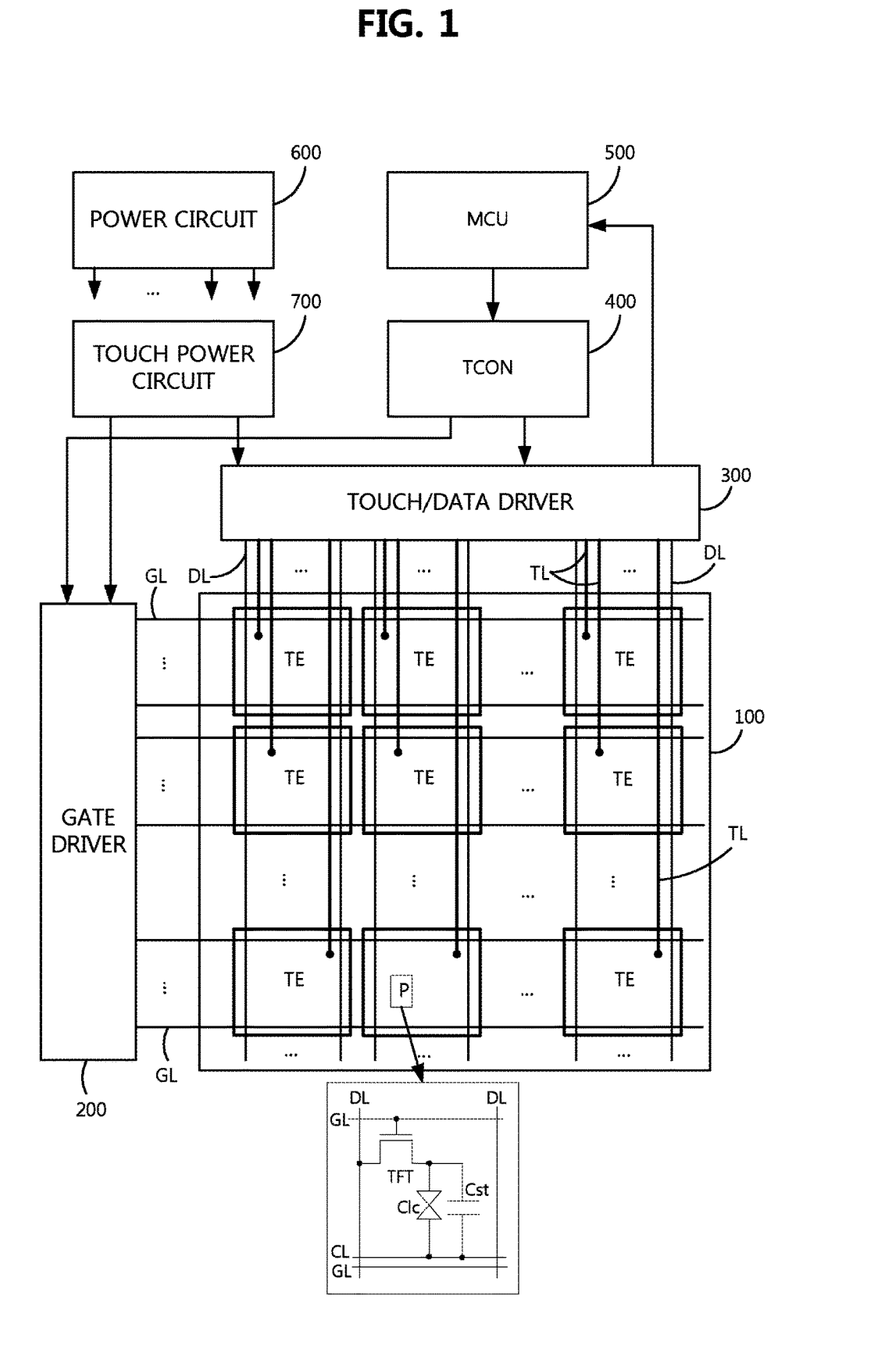
FIG. 1 is a block diagram schematically illustrating a touch display device according to an embodiment of the present disclosure.
Figure 2:
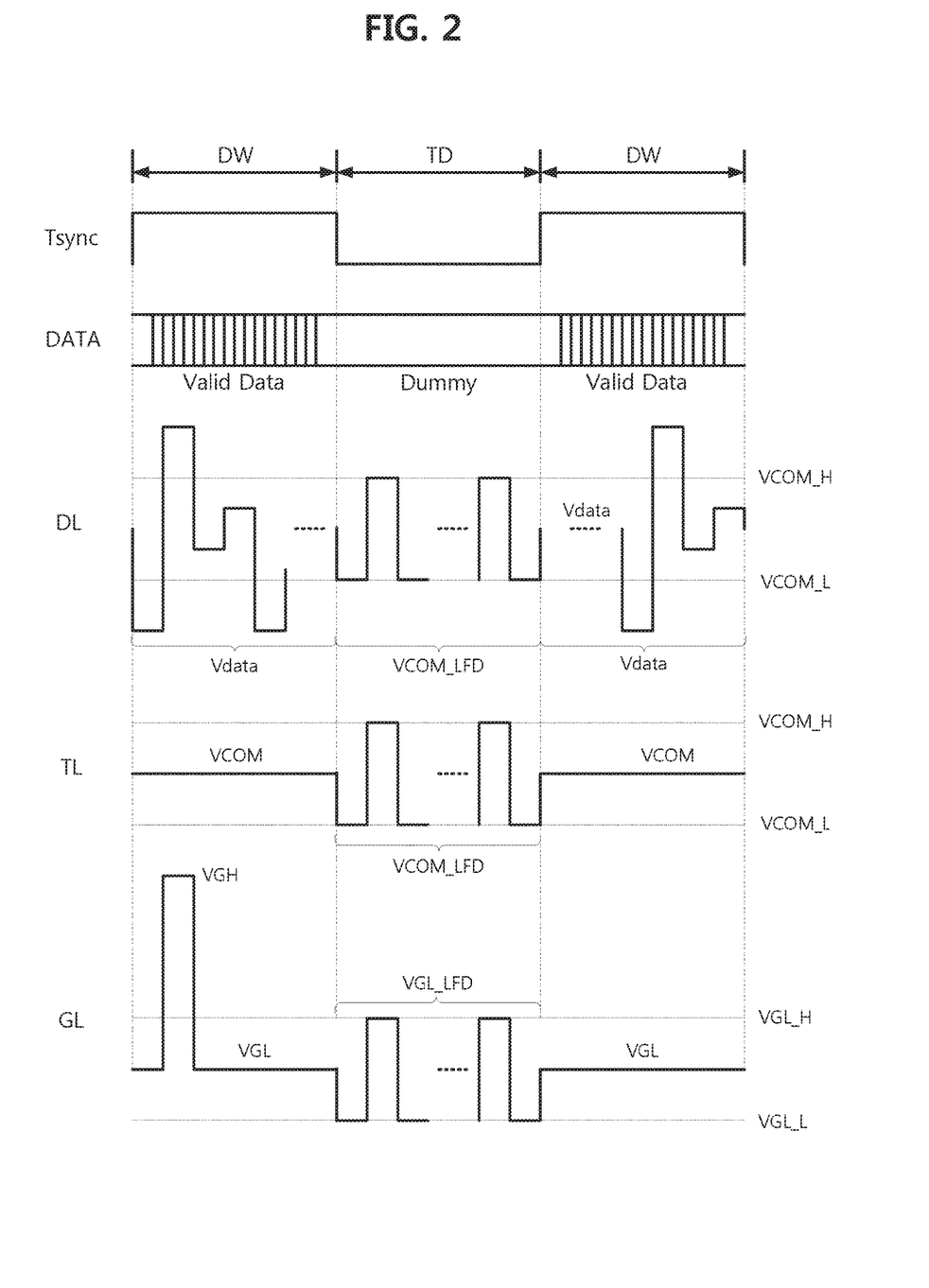
FIG. 2 is a driving waveform chart of a touch display device according to an embodiment of the present disclosure.

FIG. 1 is a block diagram schematically illustrating a touch display device according to an embodiment of the present disclosure and FIG. 2 is a driving waveform chart of a touch display device according to an embodiment of the present disclosure.

Referring to FIG. 1, the touch display device includes a panel 100, a gate driver 200, a touch-compatible data (hereinafter, touch/data) driver 300, a timing controller (hereinafter, TCON) 400, a microcontroller unit (hereinafter, MCU) 500, a power circuit 600, and a touch power circuit 700.

The panel 100, which has a touch and display function, displays images through a pixel array having pixels P arranged in a matrix form and senses whether touch is performed based on a capacitance touch sensing scheme using a common electrode-compatible touch electrode TE. The panel 100 displays images through a pixel array having pixels P arranged in a matrix form. The pixel array may be configured by red (R)/green (G)/blue (B) pixels or white (W)/R/G/B pixels.

The panel 100 may be an organic light-emitting diode display panel or a liquid crystal display panel. In embodiments of the present disclosure, the liquid crystal display panel will be described by way of example. The capacitance touch sensing scheme may use any one of a mutual capacitance touch sensing scheme and a self-capacitance touch sensing scheme. In embodiments of the present disclosure, the self-capacitance touch sensing scheme will be described by way of example.

Each of the pixels of the panel 100 includes a thin-film transistor (TFT) connected to a gate line GL and a data line DL, and a liquid crystal capacitor Clc and a storage capacitor Cst, connected between the TFT and a common line CL. The liquid crystal capacitor Clc charges a difference voltage between a data voltage supplied to a pixel electrode through the TFT and a common voltage VCOM supplied to the common electrode-compatible touch electrode TE and drives liquid crystal according to the charged voltage, thereby controlling light transmittance. The storage capacitor Cst keeps the voltage charged in the liquid crystal capacitor Clc stable.

The panel 100 includes a plurality of touch electrode groups included in the pixel array. Each of the touch electrode groups includes a plurality of touch electrodes TE arranged in the direction of the data line DL and a plurality of touch lines TL connected individually to the plurality of touch electrodes TE and connected to the touch/data driver 300. The touch electrodes TE are formed by splitting a common electrode formed in the pixel array. Each touch electrode TE is formed with a predetermined size including a plurality of pixels in consideration of the size of a touch point.

The TCON 400 receives image data and timing signals from a host system (not shown). The timing signals include a dot clock, a data enable signal, a vertical synchronization signal, and a horizontal synchronization signal. The vertical synchronization signal and the horizontal synchronization signal may be generated by counting the data enable signal and therefore may be omitted.

The TCON 400 generates gate control signals for controlling a driving timing of the gate driver 200 using the timing signals supplied from the host system and supplies the gate control signals to the gate driver 200. For example, the gate control signals include a gate start pulse and a gate shift clock, for controlling a scan operation of a shift register, and may further include a gate output enable signal for controlling an output timing of a scan pulse.

The TCON 400 generates data control signals for controlling a driving timing of the touch/data driver 300 using the timing signals supplied from the host system and may supply the data control signals to the touch/data driver 300. For example, the data control signals may include a source start pulse and a source sampling clock for controlling a latch timing of data, a source output enable signal for controlling an output timing of data, and a polarity control signal for controlling polarity of a data signal.

The TCON 400 may receive a touch synchronization signal Tsync from the MCU 500, or may generate the touch synchronization signal Tsync and supply the touch synchronization signal Tsync to the MCU 500 and the touch power circuit 700.

The touch synchronization signal Tsync indicates, as illustrated in FIG. 2, a data write period DW and a touch driving period TD by time-dividing each frame period. The data write period DW refers to a period during which image data is written in each pixel P while scanning pixels of the panel 100. The touch driving period TD refers to a period during which a touch driving signal VCOM_LFD is applied to the touch electrodes TE of the panel 100 and during which each of the touch electrodes TE of the panel 100 determines whether a touch is sensed.

The TCON 400 may perform a variety of operation or functions, such as, for example, image processing for picture quality compensation of image data supplied from the host system, reducing power consumption, and storing image-processed data in an internal memory. In addition, during the data write period DW indicated by the touch synchronization signal Tsync, the TCON 40 may supply display information, including the image data and the data control signals, to the touch/data driver 300. During the data write period DW, the TCON 400 may supply the display information, including the image data and control information, to the touch/data driver 300 through a data transmission line. During the data write period DW, the TCON 400 may read out the image data from the memory at a faster speed than a write speed, supply the image data to the touch/data driver 300, and control operation timings of the gate driver 200 and the touch/data driver 300, so that a data voltage may be written in the pixel array of the panel 100 during the data write period DW. The TCON 400 may output dummy signals such as a clock signal, etc., through the data transmission line during the touch driving period TD indicated by the touch synchronization signal Tsync.

The MCU 500 may generate and supply the touch synchronization signal Tsync to the TCON 400 and the touch power circuit 700, and may generate various timing control signals necessary for touch driving and sensing to supply the timing control signals to the touch/data driver 300 and the touch power circuit 700. In some implementations, the MCU 500 receives touch sensing information from the touch/data driver 300, processes the touch sensing information to determine whether a touch occurs, detects a touch region, generates coordinates of the touch region, and supplies the coordinates of the touch region to the host system.

The power circuit 600 generates and supplies various driving voltages required by the touch display device. The power circuit 600 generates various driving voltages necessary for driving circuits of the touch display device, e.g., the TCON 400, the MCU 500, the touch power circuit 700, the gate driver 300, the touch/data driver 300, and the panel 100, using an input voltage supplied from the exterior.

For example, the power circuit 600 may generate and output, using the input voltage, digital circuit driving voltages VCC and GND supplied to the TCON 400, the MCU 500, the touch power circuit 700, and the touch/data driver 300, an analog circuit driving voltage AVDD supplied to the touch/data driver 300, a gate-on voltage (gate-high voltage; VGH) supplied to the gate driver 300, and a common voltage VCOM and gate-off voltage (gate-low voltage; VGL) supplied to the touch power circuit 700.

The touch power circuit 700 may receive the touch synchronization signal Tsync and the timing control signals from the TCON 400 or the MCU 500. During the data write period DW, the touch power circuit 700 may supply the common voltage VCOM to the touch/data driver 300 and supply the gate-off voltage VGL to the gate driver 200, in response to the touch synchronization signal Tsync and the timing control signals. During the touch driving period TD, the touch power circuit 700 may generate a touch driving signal VCOM_LFD to supply the touch driving signal VCOM_LFD to the touch/data driver 300 and may generate a gate-off modulation signal VGL_LFD having the same phase and the same amplitude as the touch driving signal VCOM_LFD to supply the gate-off modulation signal VGL_LFD to the gate driver 300, in response to the touch synchronization signal Tsync and the timing control signals.

Referring to FIG. 2, during the touch driving period TD, the touch driving signal VCOM_LFD may be provided as a pulse form in which a common high voltage VCOM_H and a common low voltage VCOM_L periodically alternate, and the gate-off modulation signal VGL_LFD may be provided as a pulse form in which a gate-off high voltage VGL_H and a gate-off low voltage VGL_L alternate during the same period as the touch driving signal VCOM_LFD in synchronization with the touch driving signal VCOM_LFD.

The touch power circuit 700 may use the common voltage VCOM and the gate-off voltage VGL received from the power circuit 600. The touch power circuit 700 may use the common high voltage VCOM_H, the common low voltage VCOM_L, the gate-off high voltage VGL_H, and the gate-off low voltage VGL_L by converting digital values stored in the memory into analog voltages. The common high voltage VCOM_H used as the touch driving signal VCOM_LFD may be higher than the common voltage VCOM, and the common low voltage VCOM_L used as the touch driving signal VCOM_LFD may be lower than the common voltage VCOM. The gate-off high voltage VGL_H used as the gate-off modulation signal VGL_LFD may be lower than the gate high voltage VGH and may be higher than the gate-off voltage VGL. The gate-off low voltage VGL_L used as the gate-off modulation signal VGL_LFD may be lower than the gate-off voltage VGL. A difference between the common high voltage VCOM_H and the common low voltage VCOM_L may be equal to an absolute value of a difference between the gate-off high voltage VGL_H and the gate-off low voltage VGL_L. In other words, the amplitude of the touch driving signal VCOM_LFD may be equal to the amplitude of the gate-off modulation signal VGL_LFD.

During the data write period DW, the touch/data driver 300 may convert the image data supplied from the TCON 400 into an analog data signal Vdata and supply the analog data signal Vdata to the data lines DL of the panel 100, according to the data control signal supplied from the TCON 400. During the data write period DW, the touch data driver 300 may supply the common voltage VCOM supplied from the touch power circuit 700 to the touch electrodes TE through the touch lines TL, so that the touch electrodes TE serve as a common electrode.

The touch/data driver 300 may simultaneously supply, during the touch driving period TD, the touch driving signal VCOM_LFD supplied from the touch power circuit 700 to the data lines DL and the touch lines TL of the panel 100.

During the touch driving period TD, the touch/data driver 300 may supply the touch driving signal VCOM_LFD to the touch electrodes TE through the touch lines TL and then read out a signal, which is fed back through an individual touch line TL, from each of the touch electrodes TE. The touch/data driver 300 may sense variation in self-capacitance (the delayed amount of a signal) of each touch electrode TE caused by touch by differentially amplifying the touch driving signal VCOM_LFD for each touch electrode TE and the read-out signal to generate sensing data and supply the sensing data to the MCU 500. To this end, the touch/data driver 300 includes a read-out circuit.

The touch/data driver 300 is comprised of at least one touch/data integrated circuit (IC) and may be mounted on a circuit film such as a tape carrier package (TCP), a chip-on film (COF), or a flexible printed circuit (FPC) so as to be physically attached to the panel 100 through a tape automated bonding (TAB) scheme or physically mounted on the panel 100 through a chip-on glass (COG) scheme so as to be connected to a printed circuit board (PCB) 100 through the FPC.

The gate driver 200 may receive the gate control signals from the TCON 400 during the data write period DW and generates scan pulses according to the gate control signals to sequentially drive the gate lines GL. The gate driver 200 may supply a scan pulse of the gate-on voltage VGH to a corresponding gate line GL at a corresponding scan period during the data write period DW and supply the gate-off voltage VGL supplied from the touch power circuit 700 during the other data write period DW during which other gate lines GL are driven.

The gate driver 200 may supply, during the touch driving period TD, the gate-off modulation signal VGL_LFD, which is supplied instead of the gate-off voltage VGL from the touch power circuit 700, to the gate lines GL.

The gate driver 200 may be comprised of at least one gate IC and may be mounted on a circuit film such as a TCP, a COF, or an FPC so as to be attached to the panel 100 through TAB or may be mounted on the panel 100 through COG.

Figure 3:
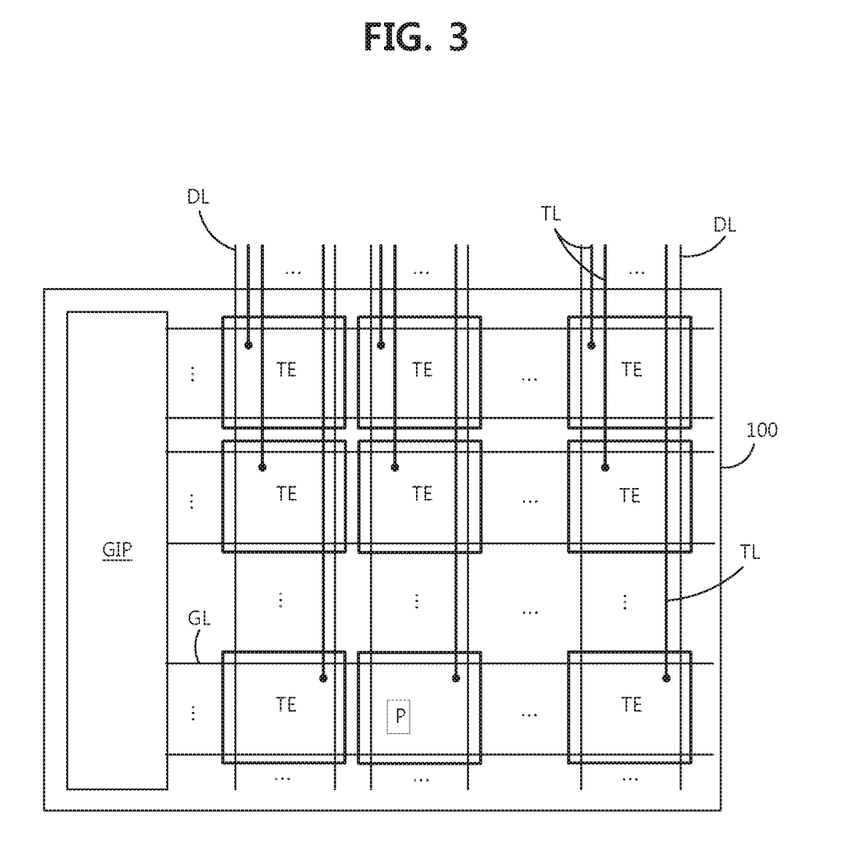
FIG. 3 is a diagram schematically illustrating a panel including a gate-in panel circuit according to an embodiment of the present disclosure.

Alternatively, the gate driver 200 may be comprised of a gate-in panel (GIP) circuit mounted in a non-display region of the panel 100 by being formed on a TFT substrate together with a TFT array constituting the pixel array of the panel 100 as illustrated in FIG. 3.

As illustrated in FIG. 2, during the touch driving period TD, the touch driving signal VCOM_LFD supplied to the data lines DL and the touch electrodes TE of the panel 100 and the gate-off modulation signal VGL_LFD supplied to the gate lines GL of the panel 100 have the same phase and the same amplitude, so that the touch electrodes TE can perform load free driving. That is, initial capacitances between the touch electrodes TE and the gate lines GL and between the touch electrodes TE and the data lines DL in the panel 100 is minimized by load free driving during the touch driving period TD and thus resistor-capacitor (RC) load of the touch electrodes TE can be minimized. Accordingly, signal distortion caused by RC load is minimized and thus touch sensing sensitivity can be improved.

Various waveforms, such as a trapezoidal wave and a sine wave, may be used for the touch driving signal VCOM_LFD and the gate-off modulation signal VGL_LFD in addition to the square waveforms illustrated in FIG. 2.

Figure 4:
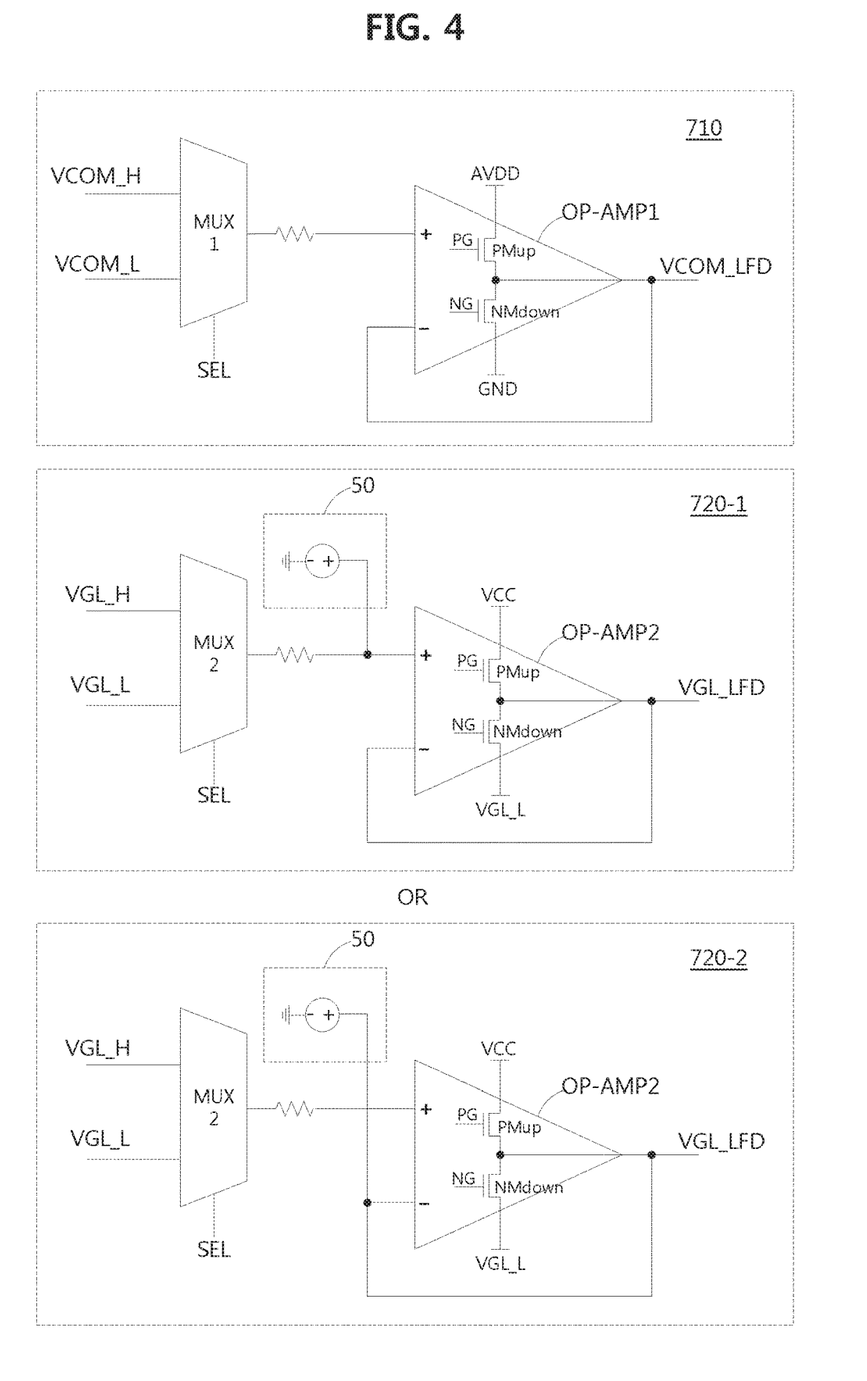
FIG. 4 is an equivalent circuit diagram illustrating an internal configuration of a touch power circuit according to an embodiment of the present disclosure.
Figure 5:
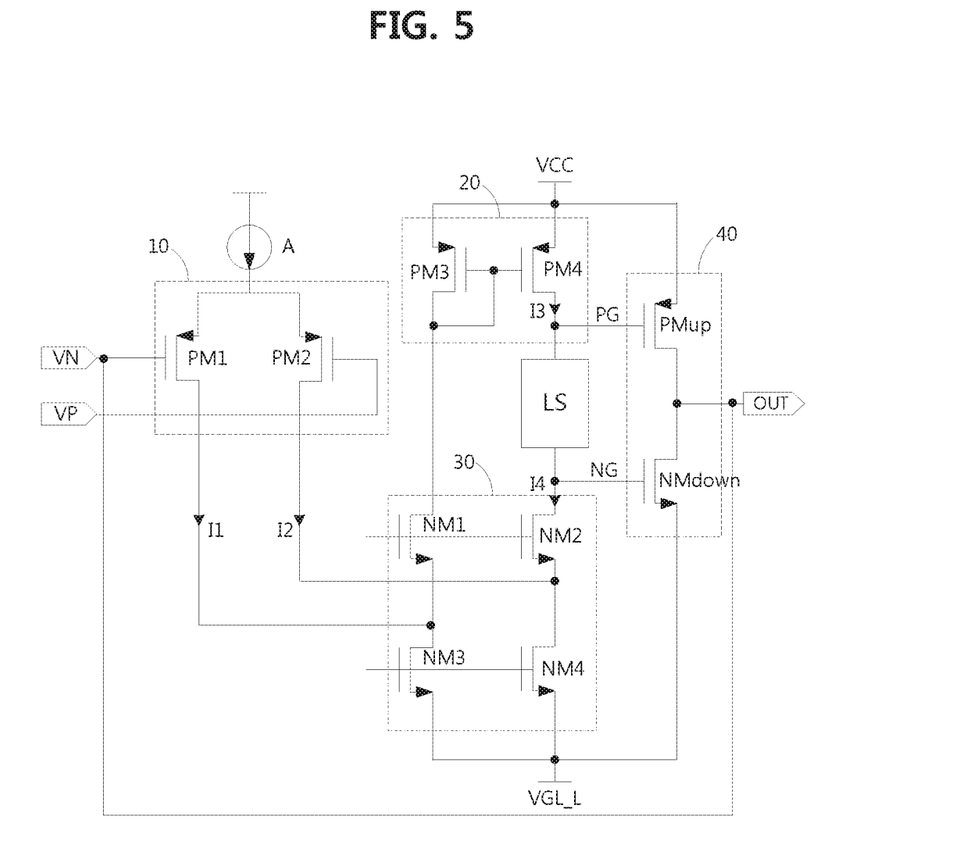
FIG. 5 is an equivalent circuit diagram illustrating an internal configuration of a second operational amplifier shown in FIG. 4.
Figure 6:
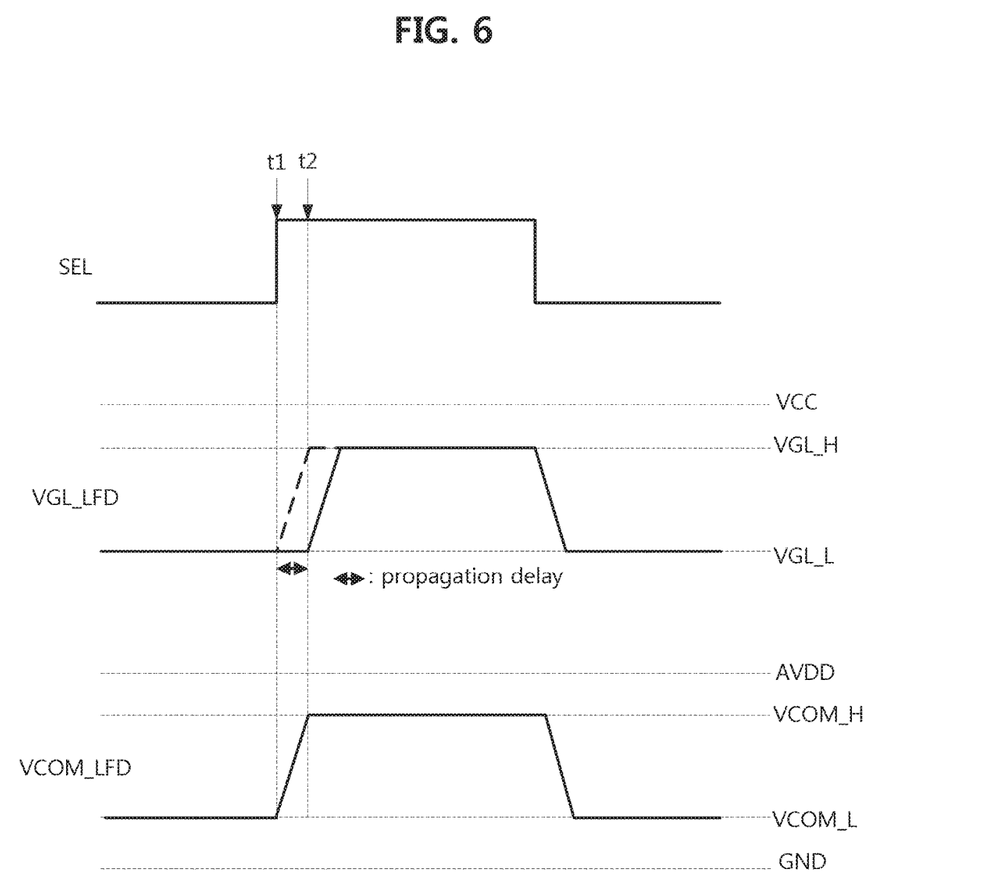
FIG. 6 is a diagram illustrating a comparison between voltage waveforms of a touch driving signal and a gate-off modulation signal output from a touch power circuit according to the related art.
Figure 7:
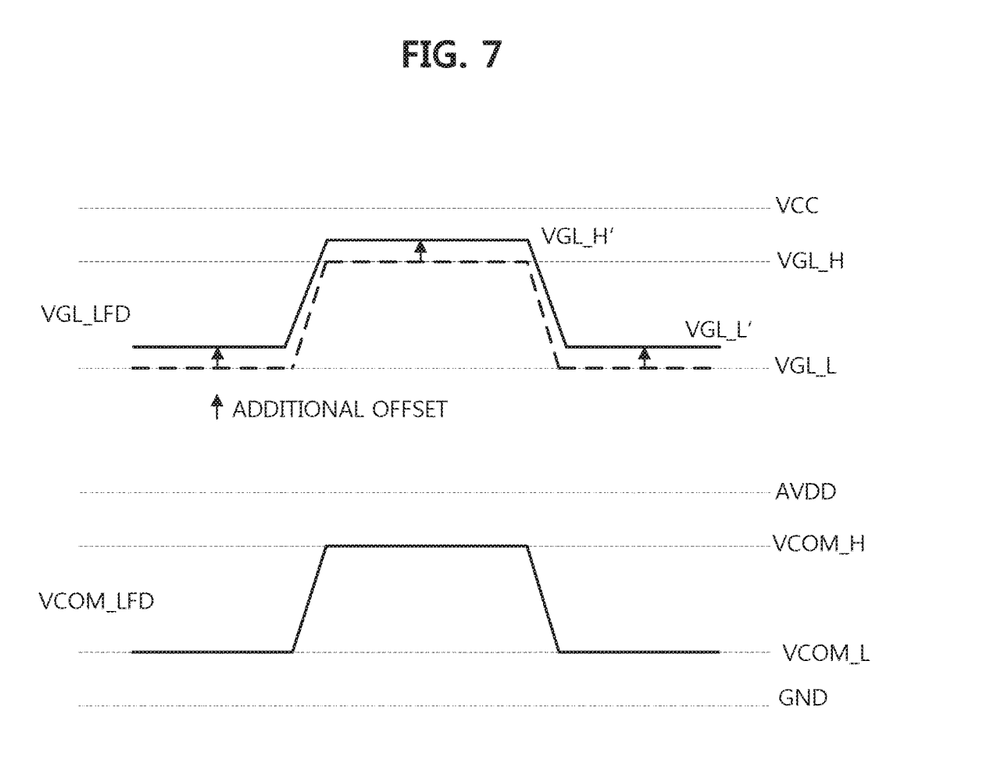
FIG. 7 is a diagram illustrating a comparison between voltage waveforms of a touch driving signal and a gate-off modulation signal output from a touch power circuit according to an embodiment of the present disclosure.

FIG. 4 is a circuit diagram illustrating a partial configuration including an operational amplifier in a touch power circuit shown in FIG. 1 according to an embodiment of the present disclosure and FIG. 5 is a circuit diagram illustrating an internal configuration of a second operational amplifier according to an embodiment of the present disclosure. FIG. 6 is a diagram illustrating output waveforms of first and second operational amplifiers according to the prior art and FIG. 7 is a diagram illustrating output waveforms of first and second operational amplifiers according to an embodiment of the present disclosure.

Referring to FIG. 4, the touch power circuit (700; FIG. 1) may include a common voltage modulator 710 for generating the touch driving signal VCOM_LFD and a gate-off voltage modulator 720 for generating the gate-off modulation signal VGL_LFD (two shown, gate-off voltage modulator 720-1 and 720-2, collectively, "gate-off voltage modulator 720"). A selection control signal SEL is supplied to the common voltage modulator 710 and the gate-off voltage modulator 720 from the MCU 500 or the TCON 400.

The common voltage modulator 710 includes a first multiplexer (hereinafter, MUX1) and a first operational amplifier (hereinafter, OP-AMP1). During the touch driving period TD, the MUX1 is used to generate the touch driving signal VCOM_LFD in a pulse form. The output of the MUX1 alternates between the common high voltage VCOM_H and the common low voltage VCOM_L in response to the selection control signal SEL. The output of the MUX1 is supplied as the input to the non-inverting input channel (+) of the OP-AMP1, which uses the input to generate the touch driving signal VCOM_LFD. The OP-AMP1 buffers and outputs the touch driving signal VCOM_LFD.

The gate-off voltage modulator 720 includes a second multiplexer (hereinafter, MUX2) and a second operational amplifier (hereinafter, OP-AMP2). During the touch driving period TD, the MUX2 is used to generate the gate-off modulation signal VGL_LFD in a pulse form. The output of the MUX2 alternates between the gate-off high voltage VGL_H and the gate-off low voltage VGL_L in response to the selection control signal SEL, which is the same signal that is applied to and controls the outputs of the MUX1. The output of the MUX2 is supplied as the input to the non-inverting input channel (+) of the OP-AMP2, which uses the input to generate the gate-off modulation signal VGL_LFD. The OP-AMP2 buffers and outputs the gate-off modulation signal VGL_LFD.

In each of the OP-AMP1 and the OP-AMP2, if an output voltage fed back to an inverting input terminal (−) is lower than an input voltage of the non-inverting input terminal (+), a gate voltage applied to a P-gate PG decreases and an output terminal is charged through a pull-up transistor PMup so that the output voltage is raised. In each of the OP-AMP1 and the OP-AMP2, if the output voltage fed back to the inverting input terminal (−) is higher than the input voltage of the non-inverting input terminal (+), a gate voltage applied to an N-gate NG increases and the output terminal is discharged through a pull-down transistor NMdown so that the output voltage is lowered.

Referring to FIG. 5, the OP-AMP2 may include a differential amplifier 10 consisting of first and second PMOS transistors (hereinafter, PM1 and PM2) electrically coupled respectively to an inverting input terminal VN and a non-inverting input terminal VP, a first current mirror 20 consisting of third and fourth PMOS transistors (hereinafter, PM3 and PM4), a second current mirror 30 consisting of first to fourth NMOS transistors (hereinafter, NM1, NM2, NM3, and NM4), and an output unit 40 consisting of a pull-up PMOS transistor (hereinafter, PMup) and a pull-down NMOS transistor (hereinafter, NMdown).

The gate for the PM1 is controlled by a voltage of the inverting input terminal VN, which is electrically coupled to an output terminal OUT. The gate for the PM1 is used to control the generation of a first current I1. The gate for the PM2 is controlled by an input voltage of the non-inverting input terminal VP and is used to control the generation of a second current I2. The PM1 and PM2 of the differential amplifier 10 are electrically coupled to a common constant current source A, which converts a difference between input voltages of the inverting input terminal VN and the non-inverting input terminal VP into the currents I1 and I2.

The PM3 and PM4 of the first current mirror 20 and the NM1, NM2, NM3, and NM4 of the second current mirror 30 convert the first and second currents I1 and I2 generated by the differential amplifier 10 into third and fourth current I3 and I4 for driving the output unit 40. A level shifter LS may be positioned between the PM4 of the first current mirror 20 and the NM2 of the second current mirror 30.

If the output voltage fed back from the output terminal OUT to the inverting input terminal VN is higher than the input voltage of the non-inverting input terminal VP, the second current I2 is greater than the first current I1 (i.e., I1<I2), which results in the fourth current I4 being greater than the third current I3 (i.e., I3<I4). As such, an N-gate voltage NG increases to turn on the NMdown component in the output unit 40. Therefore, the output terminal OUT is discharged to a second low-potential power voltage (e.g., the gate-off low voltage VGL_L). If the output voltage fed back from the output terminal OUT to the inverting input terminal VN is lower than the input voltage of the non-inverting input terminal VP, the second current I2 is less than the first current I1 (i.e., I2<I1), which results in the fourth current I4 being less than the third current I3 (i.e., I4<I3). As such, a P-gate voltage PG increases to turn on the PMup component in the output unit 40. Therefore, the output terminal OUT is charged to high-potential power voltage (e.g., VCC or VGL_H).

Referring to FIG. 4, each of the OP-AMP1 and the OP-AMP2 has a first offset voltage at the input terminals. Due to deviation of the first offset voltages between the OP-AMPs, the gate voltages PG and NG for determining output timings of the pull-up transistor PMup and the pull-down transistor NMdown may vary. As illustrated in FIG. 6, for example, propagation delay deviation (e.g., t2−t1) may occur between the respective output waveforms of the OP-AMP1 and the OP-AMP2 because of a propagation delay caused by the first offset voltage in the OP-AMP2. In this situation, for example, the first offset voltage in the OP-AMP2 may operate in the gate-off voltage region VGL_L which causes the transition of the gate-off modulation signal VGL_LFD from the low voltage level VGL_L to be delayed relative to the transition of the touch driving signal VCOM_LFD from the low voltage level VCOM_L. As illustrated in FIG. 6, the common high voltage VCOM_H output by the OP-AMP1 may be lower than a first high-potential power voltage AVDD and the common low voltage VCOM_L may be higher than a first low-potential power voltage GND, whereas the gate-off high voltage VGL_H output by the OP-AMP2 may be lower than a second high-potential power voltage VCC and the gate-off low voltage VGL_L may be identical or similar to a second low-potential power voltage. As such, when the pull-down transistor NMdown outputs the gate-off low voltage VGL_L identical or similar to the second low-potential power voltage, the pull-up transistor PMup is strongly turned off, and a rising delay occurs when the pull-up transistor PMup is turned on and raised to the gate-off high voltage VGL_H. Such a rising delay of an output waveform is generated by deviation of the first offset voltages of the OP-AMP2. Accordingly, the operational amplifiers operating in a power voltage region like that of the OP-AMP2 may generate the propagation delay deviation between output waveforms based on the first offset voltage.

As illustrated in FIG. 4, the OP-AMP2 may further include an offset voltage applier 50 for additionally applying a second offset voltage to the non-inverting input terminal (+) (gate-off modulator 720-1) or the inverting terminal (−) (gate-off modulator 720-2). The offset voltage applier 50 applies the second offset voltage of positive polarity having a larger absolute value than the first offset voltage of the OP-AMP2 to the non-inverting input terminal (+) or the inverting terminal (−), thereby causing a total offset voltage of the OP-AMP2 (i.e., first offset voltage+second offset voltage) to maintain a constant positive polarity.

For example, when a difference between the gate-off low voltage VGL_L and the gate-off high voltage VGL_H of the gate-off modulation signal VGL_LFD is about 4V, the offset voltage applier 50 may apply the second offset voltage of about 200 to 400 mV to the non-inverting input terminal (+) or the inverting terminal (−).

In the OP-AMP2, if the pull-down transistor NMdown outputs the gate-off low voltage VGL_L identical or similar to the second low-potential power voltage VGL_L, the pull-up transistor PMup may be maintained in a weakly turned-on state by applying the additional second offset voltage to the non-inverting input terminal (+) or the inverting terminal (−), a rising time can be reduced when the pull-up transistor PMup is turned on and raised to the gate-off high voltage VGL_H.

Thus, as illustrated in FIG. 7, a gate-off low voltage VGL_L' and a gate-off high voltage VGL_H' of the gate-off modulation signal VGL_LFD output from the OP-AMP2 may be level-shifted to be raised as much as an additional offset voltage while maintaining an amplitude that is the same as or substantially similar to the amplitude between the input gate-off low voltage VGL_L and the gate-off high voltage VGL_H. As a result, occurrence of delay deviation of the gate-off modulation signal VGL_LFD output from the OP-AMP2 and the touch driving signal VCOM_LFD output from the OP-AMP1 can be prevented.

Figure 8:
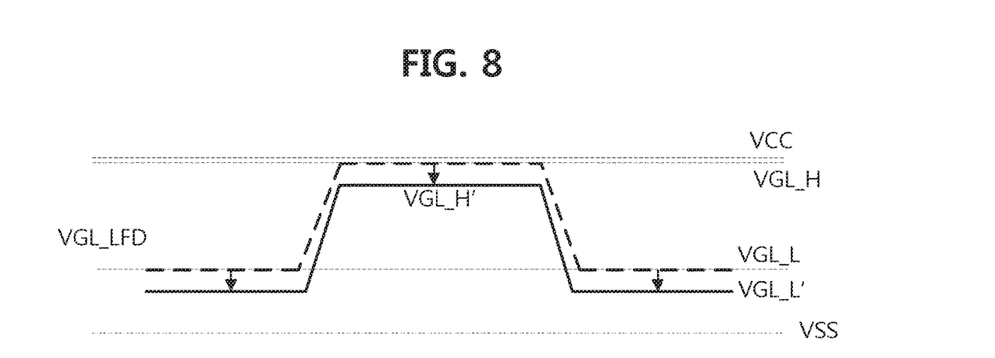
FIG. 8 is a diagram illustrating input and output waveforms of a second operational amplifier according to an embodiment of the present disclosure.

As illustrated in FIG. 8, when a voltage band similar to a high-potential power voltage VCC is used as the gate-off high voltage VGL_H of the gate-off modulation signal VGL_LFD and a voltage different from a low-potential power voltage VSS is used as the gate-off low voltage VGL_L, the offset applier 50 illustrated in FIG. 4 may be additionally applied to any one of the input terminals (+) (gate-off voltage modulator 720-1) and/or (−) (gate-off voltage modulator 720-2) of the OP-AMP2 as the second offset voltage. As a result, the gate-off low voltage VGL_L' and the gate-off high voltage VGL_H' of the gate-off modulation signal VGL_LFD output from the OP-AMP2 may be level-shifted to be lowered as much as the additional offset voltage while maintaining an amplitude that is the same as or substantially similar to the amplitude between the input gate-off low voltage VGL_L and the gate-off high voltage VGL_H.

In implementations in which any one voltage of the common high voltage VCOM_H and the common low voltage VCOM_L of the touch driving signal VCOM_LFD uses a voltage band similar to any one of the high-potential power voltage AVDD and the low-potential power voltage GND of the OP-AMP1, the propagation delay deviation may occur between output waveforms of the OP-AMP1 by the same principle discussed above.

Figure 9:
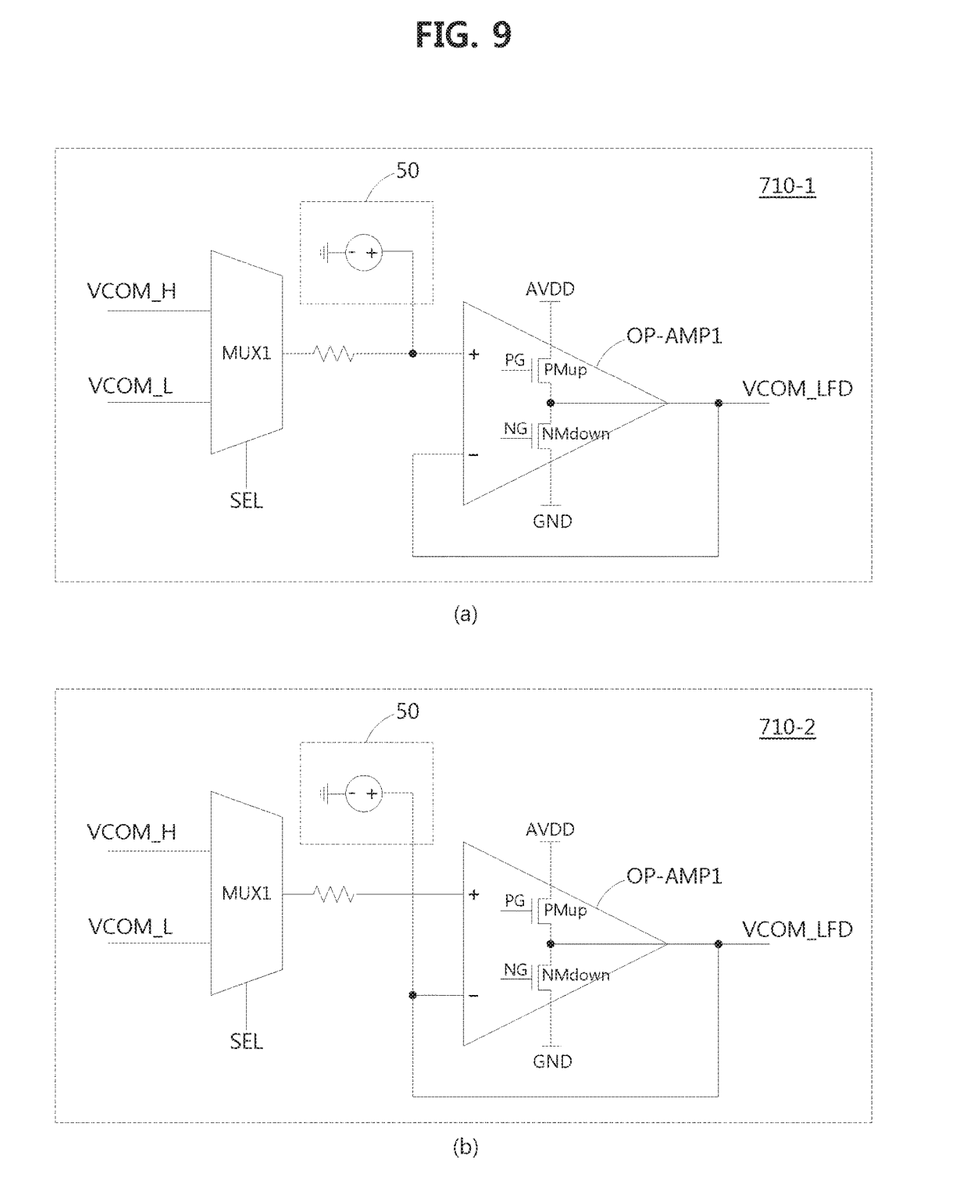
FIG. 9 is a circuit diagram illustrating the configuration of a first operational amplifier according to an embodiment of the present disclosure.

Accordingly, as illustrated in FIG. 9, the OP-AMP1 may additionally include the offset voltage applier 50 for additionally applying an offset voltage to any one of a non-inverting input terminal (+) (common voltage modulator 710-1) or an inverting input terminal (−) (common voltage modulator 710-2), thereby causing a total offset voltage of the OP-AMP1 to maintain any one polarity.

Figure 10:
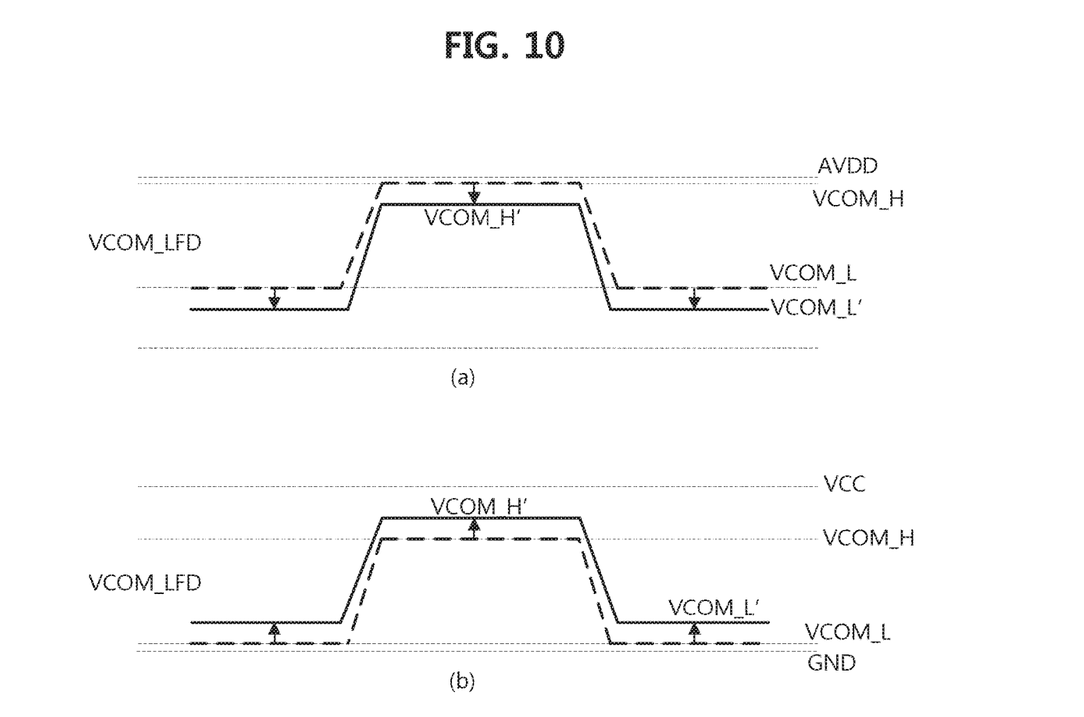
FIG. 10 is a diagram illustrating input and output waveforms of a first operational amplifier according to an embodiment of the present disclosure.

Referring to FIG. 10(a), if a voltage similar to the first high-potential power voltage AVDD of the OP-AMP1 is used as the common high voltage VCOM_H of the touch driving signal VCOM_LFD and a voltage higher than the low-potential power voltage GND is used as the common low voltage VCOM_L of the touch driving signal VCOM_LFD, a common high voltage VCOM_H' and a common low voltage VCOM_L' of the touch driving signal VCOM_LFD output from the OP-AMP1 may be level-shifted to be lowered as much as the additional offset voltage by the offset voltage applied from the offset voltage applier 50 illustrated in FIG. 9 while maintaining an amplitude that is the same as or substantially similar to the amplitude between the input common high voltage VCOM_H and the common low voltage VCOM_L.

Referring to FIG. 10(b), if a voltage lower than the second high-potential power voltage VCC of the OP-AMP1 is used as the common high voltage VCOM_H of the touch driving signal VCOM_LFD and a voltage similar to the low-potential power voltage GND is used as the common low voltage VCOM_L of the touch driving signal VCOM_LFD, the common high voltage VCOM_H' and the common low voltage VCOM_L' of the touch driving signal VCOM_LFD output from the OP-AMP1 may be level-shifted to be raised as much as an additional offset voltage by the offset voltage applied from the offset voltage applier 50 illustrated in FIG. 9 while maintaining an amplitude that is the same as or substantially similar to the amplitude between the input common high voltage VCOM_H and the common low voltage VCOM_L. In this way, the touch power circuit according to an embodiment of the present disclosure applies an additional offset voltage to an input terminal of an operational amplifier which operates in a high-potential power voltage region or a low-potential power voltage region in order to output a gate-off modulation signal or a touch driving signal, thereby setting a constant polarity of a total offset voltage of the operational amplifier in one direction.

Thus, the operational amplifier in at least some embodiments has the same propagation delay characteristic of a pulse waveform by adding the second offset voltage, regardless of the first offset voltage thereof. As a result, the touch power circuit using the operational amplifier according to such an embodiment can output the pulse waveform of the gate-off modulation signal and the pulse waveform of the touch driving signal to have the same phase. Accordingly, deviation of base touch raw data caused by phase inequality of conventional pulse waveforms can be prevented and productivity can be improved.

It will be apparent to those skilled in the art that various modifications and variations can be made in the present disclosure without departing from the spirit or scope of the disclosure. Thus, the present disclosure is intended to cover the modifications and variations of this disclosure within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:
1. A touch power circuit, comprising:
 an operational amplifier configured to buffer an input pulse in which a first voltage and a second voltage greater than the first voltage alternate, and to output the buffered input pulse to an output terminal as an output pulse, the operational amplifier including:
- a non-inverting input terminal to which the input pulse is supplied,
- an inverting input terminal connected to the output terminal, and
- an output unit that is driven based at least in part by a result of amplifying a difference between a voltage of the non-inverting input terminal and a voltage of the inverting input terminal, and that is configured to charge and discharge the output terminal using a high-potential power voltage higher than the second voltage and a low-potential power voltage similar to the first voltage, or to charge and discharge the output terminal using a high-potential power voltage similar to the second voltage and a low-potential power voltage lower than the first voltage, and
- an offset voltage applier configured to additionally supply an offset voltage having a first polarity to any one of the non-inverting input terminal and the inverting input terminal,
- wherein the output pulse is level-shifted relative to the input pulse by the offset voltage to control a propagation delay of the output pulse.

2. The touch power circuit according to claim 1, wherein the output pulse is level-shifted to be higher than the input pulse upon charging and discharging the output terminal using the high-potential power voltage higher than the second voltage and the low-potential power voltage similar to the first voltage.

3. The touch power circuit according to claim 1, wherein the output pulse is level-shifted to be lower than the input pulse upon charging and discharging the output terminal using the high-potential power voltage similar to the second voltage and the low-potential power voltage lower than the first voltage.

4. The touch power circuit according to claim 1, wherein the operational amplifier buffers a first offset voltage and receives from the offset voltage applier a second offset voltage having a positive polarity, wherein an absolute value of the second offset voltage is higher than the first offset voltage to cause a total offset voltage of the operational amplifier to constantly maintain the positive polarity of the second offset voltage.

5. The touch power circuit according to claim 1, wherein the first voltage is a gate-off low voltage, the second voltage is a gate-off high voltage, the input pulse is a first gate-off modulation signal, and the output pulse is a second gate-off modulation signal,
- wherein the output unit of the operational amplifier is configured to charge and discharge the output terminal using a high-potential power voltage higher than the gate-off high voltage and a low-potential power voltage similar to the gate-off low voltage, or to charge and discharge the output terminal using a high-potential power voltage similar to the gate-off high voltage and a low-potential power voltage lower than the gate-off low voltage, and
- wherein the second gate-off modulation signal is level-shifted relative to the first gate-off modulation signal by the offset voltage.

6. The touch power circuit according to claim 5, wherein the second gate-off modulation signal is level-shifted to be higher than the first gate-off modulation signal upon charging and discharging the output terminal using the high-potential power voltage higher than the gate-off high voltage and the low-potential power voltage similar to the gate-off low voltage.

7. The touch power circuit according to claim 5, wherein the second gate-off modulation signal is level-shifted to be lower than the first gate-off modulation signal upon charging and discharging the output terminal using the high-potential power voltage similar to the gate-off high voltage and the low-potential power voltage lower than the gate-off low voltage.

8. The touch power circuit according to claim 5, further comprising:
- a second operational amplifier configured to buffer a first touch driving signal in which a common high voltage and a common low voltage alternate, and to output the buffered first touch driving signal as a second touch driving signal, wherein the second touch driving signal and the second gate-off modulation signal have a same phase and a same amplitude.

9. The touch power circuit according to claim 1,
- wherein the first voltage is a common low voltage, the second voltage is a common high voltage, the input pulse is a first touch driving signal, and the output pulse is a second touch driving signal,
- wherein the output unit of the operational amplifier is configured to charge and discharge the output terminal using the high-potential power voltage higher than the common high voltage and the low-potential power voltage similar to the common low voltage, or to charge and discharge the output terminal using the high-potential power voltage similar to the common high voltage and the low-potential power voltage lower than the common low voltage, and
- wherein the second touch driving signal is level-shifted relative to the first touch driving signal by the offset voltage.

10. The touch power circuit according to claim 9, wherein the second touch driving signal is level-shifted to be higher than the first touch driving signal upon charging and discharging the output terminal using the high-potential power voltage higher than the common high voltage and the low-potential power voltage similar to the common low voltage.

11. The touch power circuit according to claim 9, wherein the second touch driving signal is level-shifted to be lower than the first touch driving signal upon charging and discharging the output terminal using the high-potential power voltage similar to the gate-off high voltage and the low-potential power voltage lower than the common low voltage.

12. The touch power circuit according to claim 9, wherein the operational amplifier is configured to buffer a first gate-off modulation signal in which a gate-off low voltage and a gate-off high voltage alternate, and to output the buffered first gate-off modulation signal as a second gate-off modulation signal,
- wherein the second gate-off modulation signal and the second touch driving signal have a same phase and a same amplitude.

13. A touch display device, comprising:
- a touch power circuit;
- a touch-compatible data driver configured to supply a first touch driving signal supplied from the touch power circuit to touch electrodes and data lines of a panel during a touch driving period; and
- a gate driver configured to supply a first gate-off modulation signal supplied from the touch power circuit to gate lines of the panel during the touch driving period, the touch power circuit comprising:
first operational amplifier configured to buffer an input pulse in which a first voltage and a second voltage greater than the first voltage alternate, and to output the buffered input pulse to an output terminal as an output pulse, the first operational amplifier including:
a non-inverting input terminal to which the input pulse is supplied,
an inverting input terminal connected to the output terminal, and
an output unit that is driven at least in part by a result of amplifying a difference between a voltage of the non-inverting input terminal and a voltage of the inverting input terminal, and that is configured to charge and discharge the output terminal using a high-potential power voltage higher than the second voltage and a low-potential power voltage similar to the first voltage, or to charge and discharge the output terminal using a high-potential power voltage similar to the second voltage and a low-potential power voltage lower than the first voltage, and
an offset voltage applier configured to supply an offset voltage having a first polarity to any one of the non-inverting input terminal and the inverting input terminal,
wherein:
the output pulse is level-shifted relative to the input pulse by the offset voltage,
the first voltage is a gate-off low voltage, the second voltage is a gate-off high voltage, the input pulse is a second gate-off modulation signal, and the output pulse is the first gate-off modulation signal;
a second operational amplifier configured to buffer a second touch driving signal in which a common high voltage and a common low voltage alternate, and to output the buffered second touch driving signal as the first touch driving signal, wherein the first gate-off modulation signal is level-shifted relative to the second gate-off modulation signal by the offset voltage to adjust a propagation delay deviation between the first operational amplifier and the second operational amplifier to provide the first touch driving signal and the first gate-off modulation signal having a same phase and a same amplitude.

14. The touch display device according to claim 13, wherein the first gate-off modulation signal is level-shifted to be higher than the second gate-off modulation signal upon charging and discharging the output terminal using the high-potential power voltage that is higher than the gate-off high voltage and the low-potential power voltage that is similar to the gate-off low voltage.

15. The touch display device according to claim 13, wherein the first gate-off modulation signal is level-shifted to be lower than the second gate-off modulation signal upon charging and discharging the output terminal using the high-potential power voltage that is similar to the gate-off high voltage and the low-potential power voltage that is lower than the gate-off low voltage.

16. A touch display device, comprising:
a touch power circuit;
a touch-compatible data driver configured to supply a first touch driving signal supplied from the touch power circuit to touch electrodes and data lines of a panel during a touch driving period; and
a gate driver configured to supply a first gate-off modulation signal supplied from the touch power circuit to gate lines of the panel during the touch driving period,
the touch power circuit comprising:
an operational amplifier configured to buffer an input pulse in which a first voltage and a second voltage greater than the first voltage alternate, and to output the buffered input pulse to an output terminal as an output pulse, the operational amplifier including:
a non-inverting input terminal to which the input pulse is supplied,
an inverting input terminal connected to the output terminal, and
an output unit that is driven based at least in part by a result of amplifying a difference between a voltage of the non-inverting input terminal and a voltage of the inverting input terminal, and that is configured to charge and discharge the output terminal using a high-potential power voltage higher than the second voltage and a low-potential power voltage similar to the first voltage, or to charge and discharge the output terminal using a high-potential power voltage similar to the second voltage and a low-potential power voltage lower than the first voltage, and
an offset voltage applier configured to additionally supply an offset voltage having a first polarity to any one of the non-inverting input terminal and the inverting input terminal,
wherein:
the first voltage is a common low voltage, the second voltage is a common high voltage, the input pulse is a second touch driving signal, and the output pulse is the first touch driving signal, and
the first touch driving signal is level-shifted relative to the second touch driving signal by the offset voltage to vary a propagation delay of the first touch driving signal.

17. The touch power circuit according to claim 16, wherein the first touch driving signal is level-shifted to be higher than the second touch driving signal upon charging and discharging the output terminal using the high-potential power voltage that is higher than the common high voltage and the low-potential power voltage that is similar to the common low voltage.

18. The touch power circuit according to claim 16, wherein the first touch driving signal is level-shifted to be lower than the second touch driving signal upon charging and discharging the output terminal using the high-potential power voltage similar to the gate-off high voltage and the low-potential power voltage lower than the common low voltage.

19. The touch power circuit according to claim 16, further comprising:
a second operational amplifier configured to buffer the first gate-off modulation signal in which a gate-off low voltage and a gate-off high voltage alternate, and to output the buffered first gate-off modulation signal as a second gate-off modulation signal,
wherein the second gate-off modulation signal and the second touch driving signal have a same phase and a same amplitude.

* * * * *